(12) United States Patent
Totsuka et al.

(10) Patent No.: US 7,135,416 B2
(45) Date of Patent: Nov. 14, 2006

(54) METHOD OF MANUFACTURING SEMICONDUCTOR DEVICE

(75) Inventors: Masahiro Totsuka, Tokyo (JP);
Tomoki Oku, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 101 days.

(21) Appl. No.: 10/784,947

(22) Filed: Feb. 25, 2004

(65) Prior Publication Data
US 2004/0224529 A1 Nov. 11, 2004

(30) Foreign Application Priority Data
May 9, 2003 (JP) ............ P 2003-131263

(51) Int. Cl.
*H01L 21/31* (2006.01)
(52) U.S. Cl. ............ 438/767; 438/194; 438/285; 438/574; 438/775; 438/777
(58) Field of Classification Search ............ 438/194, 438/285, 574, 767, 775, 777
See application file for complete search history.

(56) References Cited

U.S. PATENT DOCUMENTS

| | | | | |
|---|---|---|---|---|
| 5,766,695 | A * | 6/1998 | Nguyen et al. | 427/553 |
| 6,303,473 | B1 * | 10/2001 | Heffernan et al. | 438/483 |
| 6,592,771 | B1 * | 7/2003 | Yamanaka et al. | 216/63 |
| 6,762,083 | B1 * | 7/2004 | Lee et al. | 438/172 |
| 2001/0040246 | A1 * | 11/2001 | Ishii | 257/192 |
| 2004/0144991 | A1 * | 7/2004 | Kikkawa | 257/103 |
| 2004/0192043 | A1 * | 9/2004 | Makita et al. | 438/689 |
| 2005/0090032 | A1 * | 4/2005 | Kim et al. | 438/46 |
| 2005/0136627 | A1 * | 6/2005 | Melas | 438/483 |

FOREIGN PATENT DOCUMENTS

JP 6-244409 9/1994

OTHER PUBLICATIONS

Spruytte, Sylvia G.; MBE Growth on Nitride-Arsenide Materials for Long Wavelength Optoelectronics; Dec. 3, 1999; MRS Internet J. Nitride Semicond. Res. 5S1, W8.4 (2000).*
Vaudo, R. P.; Atomic-nitrogen production in a radio-frequency plasma source; Nov. 1, 1993; Optical Society of America, Optics Letter; vol. 18, No. 21.*
Blant, A. V.; Nitrogen species from radio frequency plasma sources used for molecular beam epitaxy growth of GaN; Sep. 3, 1999; Plasma Sources Sci. Technol. 9 (2000) 12-17.*
T. Hashizume, "Chemical and electronic properties of GaN and AlGaN Surfaces," *Tech. Report of IEICE*, Oct. 2002, pp. 1-6, *The Institute of Electronics, Information and Communication Engineers, Japan.*

* cited by examiner

*Primary Examiner*—Zandra V. Smith
*Assistant Examiner*—Bac H. Au
(74) *Attorney, Agent, or Firm*—Leydig, Voit & Mayer, Ltd.

(57) ABSTRACT

A method of manufacturing a semiconductor device including a gallium nitride related semiconductor. The method include preparing a substrate having surface of a gallium nitride related semiconductor; contacting the surface with atomic nitrogen, which is obtained by decomposing a nitrogen-containing gas in a catalytic reaction, to nitride the surface; and forming, on the surface, a gate electrode and source and drain electrodes opposing each other across the gate electrode.

7 Claims, 7 Drawing Sheets

METHOD OF MANUFACTURING SEMICONDUCTOR DEVICE

CROSS-REFERENCE TO RELATED APPLICATION

Related patent application is commonly assigned Japanese Patent Application No. 2003-131263 filed on May 9, 2003, which is incorporated by reference into the present patent application.

BACKGROUND OF THE INVENTION

1. Field of the Invention

The present invention relates to a surface stabilizing method for gallium nitride related semiconductor and a method of manufacturing a semiconductor device using the same, and more particularly, to a method which uses a catalytic chemical vapor reaction apparatus.

2. Description of the Related Art

In a field effect transistor in which gallium nitride (GaN) is used as the material of the substrate, it is difficult to obtain excellent DC and high-frequency characteristics. This is due to traps at a surface of the substrate, and hence, it is necessary to stabilize the surface. According to a conventional technique, the substrate is treated with a plasma of $N_2$, $NH_3$ or the like, so that voids created by nitrogen atoms, oxygen atoms and the like on the surface of the gallium nitride substrate are replaced by nitrogen atoms (which is called nitriding), and the surface is stabilized (JP, 06-244409, A).

However, treatment of a surface of a substrate inevitably results in plasma-induced damage, which adversely affects electric characteristics and the like of a semiconductor device fabricated using such a substrate.

SUMMARY OF THE INVENTION

The present invention aims at providing a method of manufacturing a semiconductor device using a gallium nitride related semiconductor without plasma-induced damage.

The present invention is directed to a method of manufacturing a semiconductor device using a gallium nitride related semiconductor, having: a step of preparing a substrate whose surface is formed by a gallium nitride related semiconductor; a nitriding step of contacting the surface with atom-state nitrogen which is obtained by decomposing nitrogen-containing gas by means of a catalytic reaction, to thereby nitride the surface; and an electrode forming step of forming, on the surface, a gate electrode and source and drain electrodes opposing each other through the gate electrode.

DETAILED DESCRIPTION OF THE PREFERRED EMBODIMENTS

Figure 1:
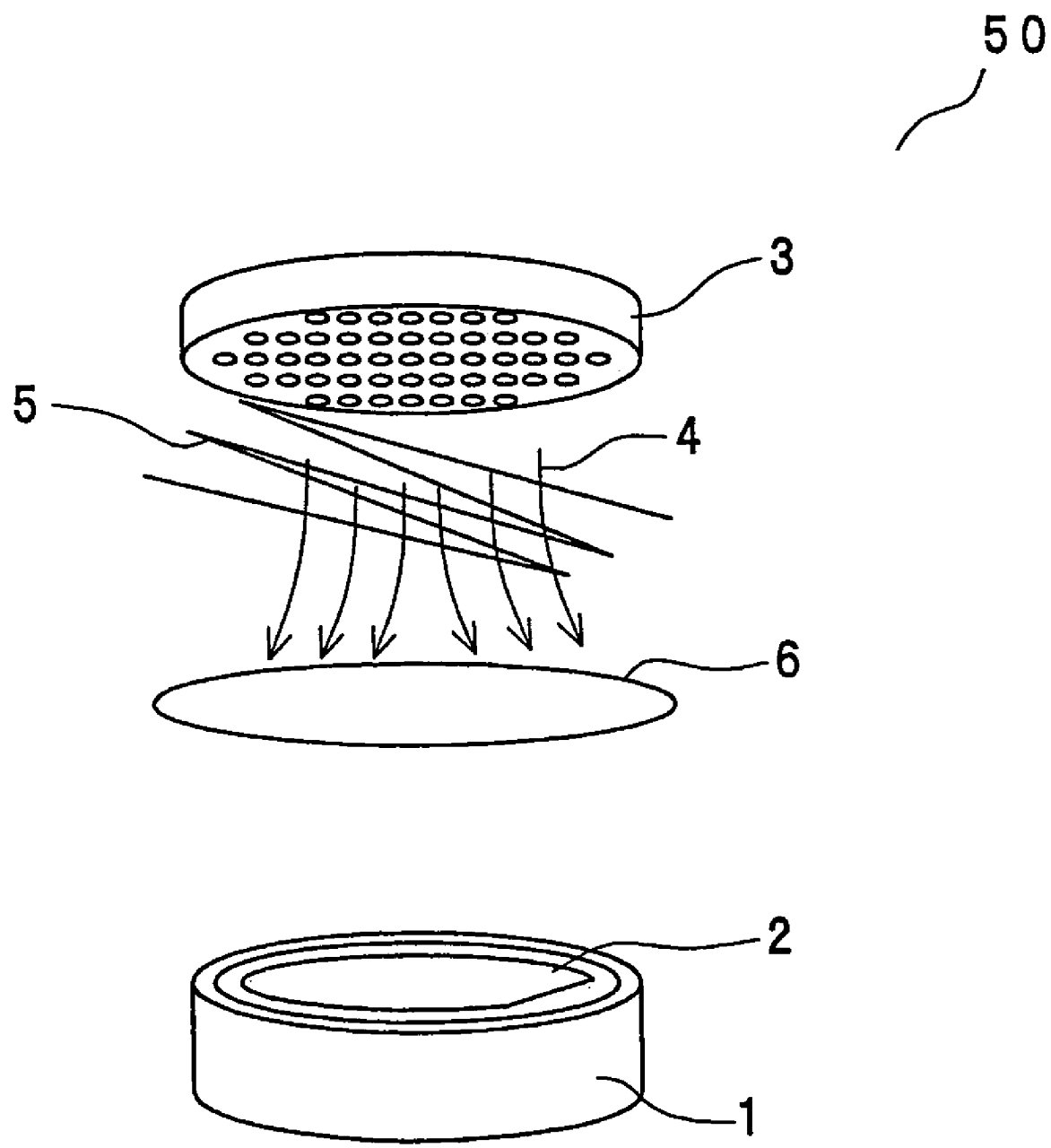
FIG. 1 is a schematic view of the catalytic chemical vapor reaction apparatus used in the preferred embodiment of the present invention.

FIG. 1 is a schematic view showing the inside of a catalytic chemical vapor reaction apparatus, generally denoted at 50, used in this embodiment.

The catalytic chemical vapor reaction apparatus 50 has a substrate stage 1 inside a chamber (not shown). On the substrate stage 1, there is a wafer 2 whose surface is to be stabilized. In addition, a gas introduction portion 3 is disposed inside the chamber in such a manner that the gas introduction portion 3 is approximately opposed to the substrate stage 1. The gas introduction portion 3 has a plurality of holes for instance, thereby allowing supply of reactive gas 4 through these holes.

Disposed in the vicinity of the gas introduction portion 3 is a heat catalyst member 5 formed by a tungsten wire for instance. A distance between the substrate stage 1 and the heat catalyst member 5 is from about 20 mm to about 100 mm.

A shutter 6 is disposed between the substrate stage 1 and the heat catalyst member 5. When the shutter 6 opens, surface stabilizing treatment of the wafer 2 is initiated, and when the shutter 6 closes, surface stabilizing treatment of the wafer 2 is finished.

Surface stabilizing treatment of a gallium nitride related substrate will now be described with reference to FIG. 1.

First, the wafer 2 formed by a gallium nitride related semiconductor is placed on the substrate stage 1 as described above. The substrate stage 1 has a heater and holds the wafer 2 at a temperature of 100° C. for example.

Next, the reactive gas 4 containing nitride, $N_2$, $NH_3$ or the like for instance, is introduced from the gas introduction portion 3. When $NH_3$ is used, the rate of gas flow is 100 sccm and the degree of vacuum is 10 Pa, for example. Further, the surface temperature of the heat catalyst member 5 of tungsten for instance is 1500° C.

Through a catalytic reaction caused by the heat catalyst member 5, the reactive gas 4 supplied from the gas introduction portion 3 is decomposed into atom-state nitrogen.

These conditions are set with the shutter 6 closed, and after the conditions have been stabilized, the shutter 6 opens. With the shutter 6 open, atom-state nitrogen is supplied upon the surface of the wafer 2, whereby the surface is nitrided, i.e., stabilized. To terminate the surface stabilization, the supply of the reactive gas 4 or the like is stopped after closing the shutter 6.

In this manner, atom-state nitrogen is supplied upon the surface of the wafer 2 which is formed by a gallium nitride related semiconductor, nitrogen-induced voids, oxygen atoms (natural oxygen film) and the like existing at the surface of the wafer 2 are substituted with nitrogen atoms, thus achieving surface stabilization of the wafer 2.

Although this embodiment requires to nitride and accordingly stabilize the surface of the wafer 2 which is formed by a gallium nitride related semiconductor, an Al layer may be formed in advance on the surface of the wafer 2 which is formed by a gallium nitride related semiconductor and the aluminum layer may then be nitrided to form an AlN layer for surface stabilization.

According to this method, the Al layer is deposited on the surface of the wafer 2 before loading the wafer 2 into the catalytic chemical vapor reaction apparatus 50. The film thickness of the Al layer is from about 10 angstroms to about 50 angstroms, and preferably, about 20 angstroms.

Further, gallium nitride related semiconductors include, in addition to those of GaN, those of AlGaN and the like which are obtained by substituting Ga and/or N of GaN with other atoms.

The following examples are applications of the surface stabilizing method according to the preferred embodiment described above to manufacturing of a semiconductor device. While the following will be directed to a field effect transistor, the surface stabilizing method may be applied to other semiconductor devices such as a HEMT.

EXAMPLE 1

FIGS. 2A–2D are cross sectional views which show steps of manufacturing a field effect transistor according to the example 1, generally denoted at 100. These manufacturing steps include the following steps 1 through 4.

Figure 2A:
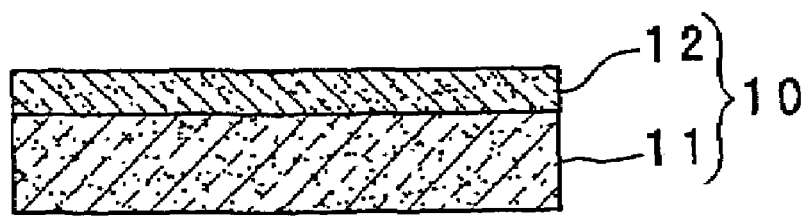
FIGS. 2A–2D are cross sectional views showing steps of manufacturing the field effect transistor according to the example 1.

Step 1: As shown in FIG. 2A, the substrate 10 having the substrate 11 of SiC or sapphire seating the GaN epitaxial layer 12 is prepared.

Figure 2B:
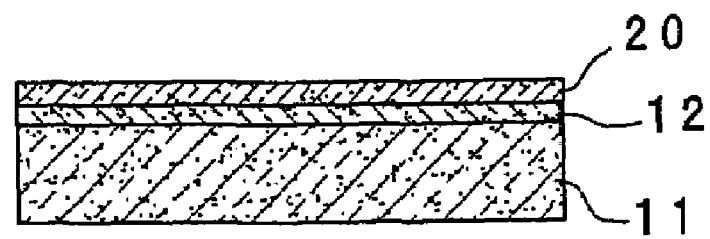

Step 2: As shown in FIG. 2B, using the catalytic chemical vapor reaction apparatus 50 described above, a surface of the epitaxial layer 12 is nitrided, thereby forming a GaN surface-nitrided layer (stabilized layer) 20.

Figure 2C:
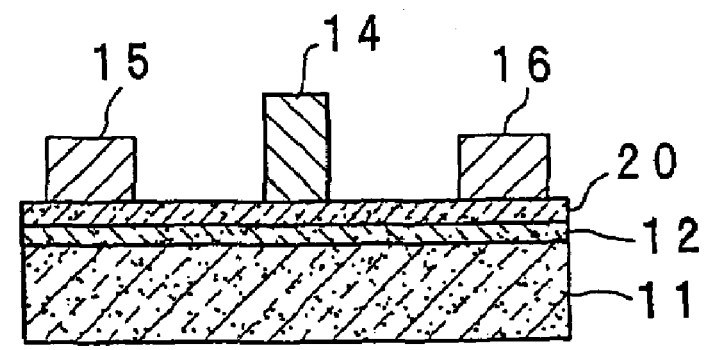

Step 3: As shown in FIG. 2C, on the GaN surface-nitrided layer 20, a gate electrode 14, and source and drain electrodes 15 and 16 opposing each other through the gate electrode 14 are formed.

Figure 2D:
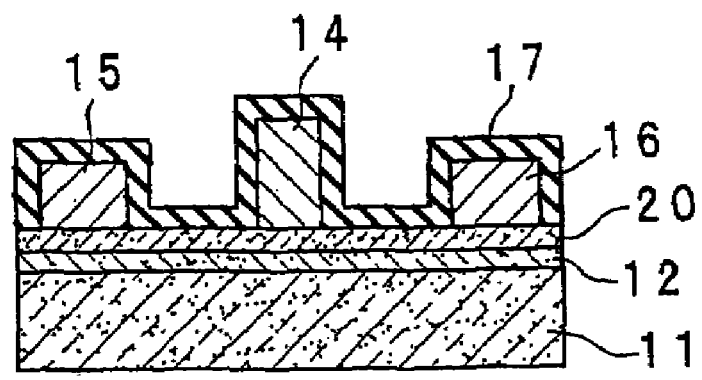

Step 4: As shown in FIG. 2D, a passivation film 17 of silicon nitride for instance is formed so as to cover the gate electrode 14 and the like. At this step, the field effect transistor 100 is completed.

In the field effect transistor 100, the interface between the gate electrode 14, the source and drain electrodes 15 and 16, and the passivation film 17 and the GaN epitaxial layer 12 is stabilized.

While the example 1 requires to directly nitride the surface of the GaN epitaxial layer 12, an aluminum layer may be vapor-deposited on the GaN epitaxial layer 12 and then nitrided to thereby stabilize the surface as that of an aluminum nitride layer. This is similar in the following examples 2 through 5.

EXAMPLE 2

Figure 3A:
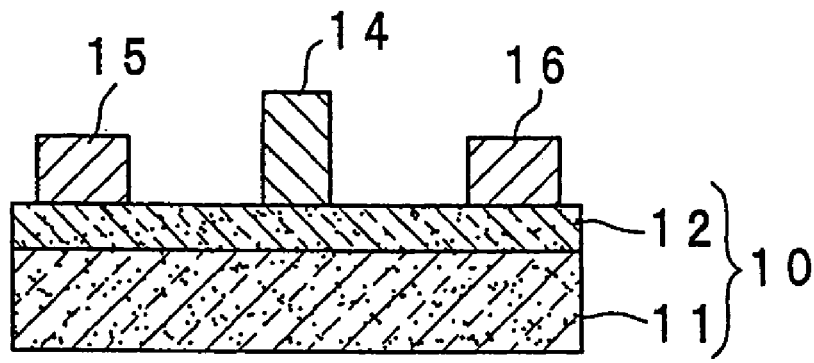
FIGS. 3A–3C are cross sectional views showing steps of manufacturing the field effect transistor according to the example 2.
Figure 3B:
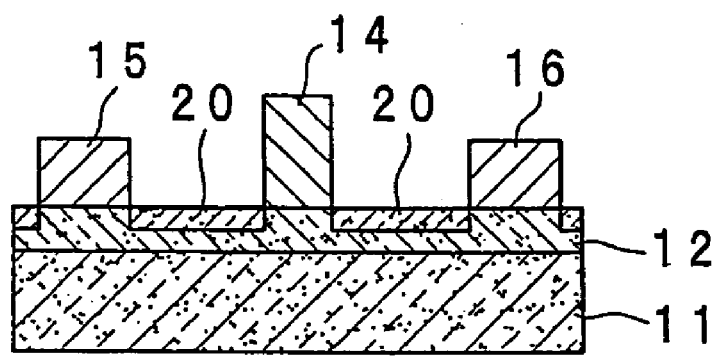
Figure 3C:
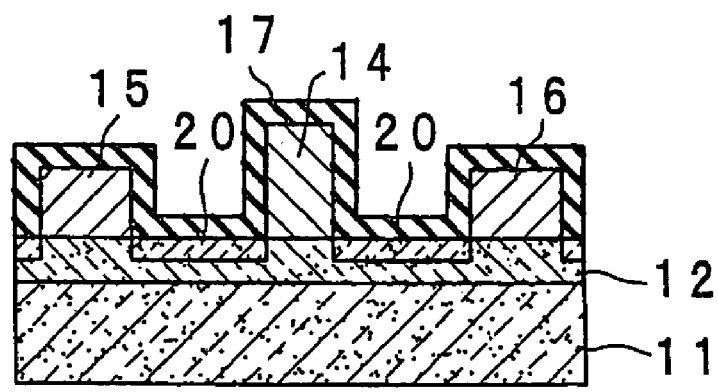

FIGS. 3A–3C are cross sectional views which show steps of manufacturing a field effect transistor according to the example 2, generally denoted at 200. In FIGS. 3A–3C, the same reference symbols as those used in FIGS. 2A–2D denote the same or corresponding portions. These manufacturing steps include the following steps 1 through 3.

Step 1: As shown in FIG. 3A, the substrate 10 having the substrate 11 of SiC or sapphire seating the GaN epitaxial layer 12 is prepared. Following this, the gate electrode 14, the source electrode 15 and the drain electrode 16 are formed on the epitaxial layer 12.

Step 2: As shown in FIG. 3B, using the catalytic chemical vapor reaction apparatus 50, a surface of the epitaxial layer 12 is nitrided within an area located between the source electrode 15 and the gate electrode 14 and within an area located between the drain electrode 16 and the gate electrode 14, thereby forming the GaN surface-nitrided layer 20.

Step 3: As shown in FIG. 3C, the passivation film 17 of silicon nitride for instance is formed so as to cover the gate electrode 14 and the like. At this step, the field effect transistor 200 is completed. The passivation film 17 of SiN, SiO, AlN, $Al_2O_3$ or the like may be successively formed in the same Cat-CVD chamber in which the nitriding step (step 2) is performed, or may be successively formed in another deposition apparatus for Cat-CVD, ECR-CVD, P-CVD, ECR-sputter or the like which is connected to the Cat-CVD chamber through the high vacuum.

In the field effect transistor 200, since the GaN surface-nitrided layer 20 is formed immediately before forming the passivation film 17, a better interface between the passivation film 17 and the epitaxial layer 12 is obtained.

EXAMPLE 3

FIGS. 4A–4E are cross sectional views which show steps of manufacturing a field effect transistor according to the example 3, generally denoted at 300. In FIGS. 4A–4E, the same reference symbols as those used in FIGS. 2A–2D denote the same or corresponding portions. These manufacturing steps include the following steps 1 through 5.

Figure 4A:
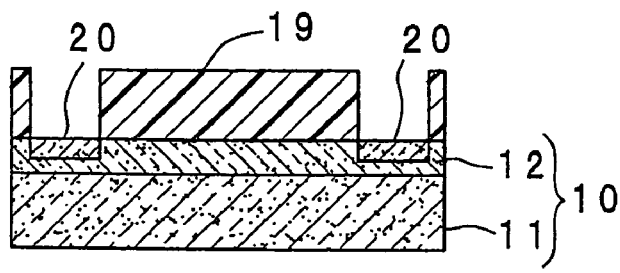
FIGS. 4A–4E are cross sectional views showing steps of manufacturing the field effect transistor according to the example 3.

Step 1: As shown in FIG. 4A, the substrate 10 having the substrate 11 of SiC or sapphire seating the GaN epitaxial layer 12 is prepared. Following this, a resist mask 19 is formed on the epitaxial layer 12 and an opening portion is formed on a source/drain region. Further, using the resist mask 19, a surface of the source/drain region is nitrided, whereby the GaN surface-nitrided layer 20 is formed.

Figure 4B:
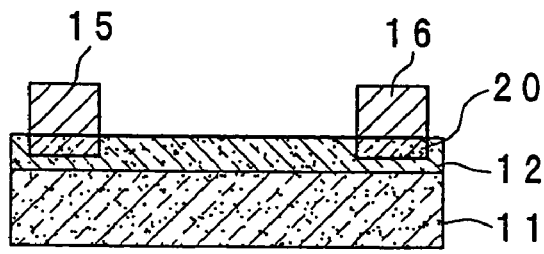

Step 2: As shown in FIG. 4B, by a lift-off method using the resist mask 19 for instance, the source and drain electrodes 15 and 16 are formed. The source and drain electrodes 15 and 16 are formed on the GaN surface-nitrided layer 20.

Figure 4C:
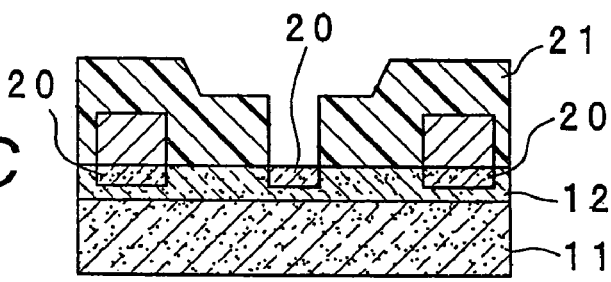

Step 3: As shown in FIG. 4C, a resist mask 21 is formed on the epitaxial layer 12 and an opening portion is formed on a gate region. In addition, using the resist mask 21, a surface of the gate region is nitrided, whereby the GaN surface-nitrided layer 20 is formed.

Figure 4D:
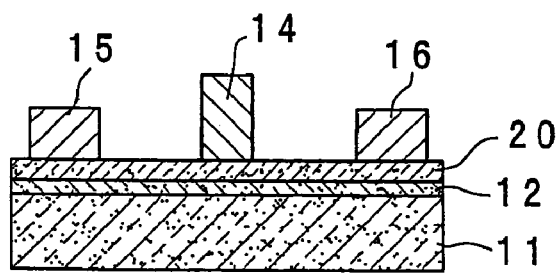

Step 4: As shown in FIG. 4D, by a lift-off method using the resist mask 21 for instance, the gate electrode 14 is formed on the GaN surface-nitrided layer 20. Further, the remaining surface of the GaN epitaxial layer 12 is stabilized, whereby the GaN surface-nitrided layer 20 is formed.

Figure 4E:
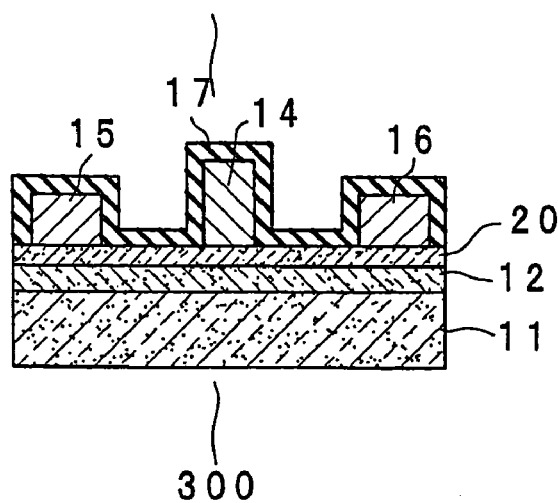

Step 5: As shown in FIG. 4E, the passivation film 17 of silicon nitride for instance is formed so as to cover the entire surface. At this step, the field effect transistor 300 is completed. The passivation film 17 may be successively formed in the same Cat-CVD chamber in which the nitriding step (step 4) is performed, or may be successively formed in another deposition apparatus for Cat-CVD, ECR-CVD, P-CVD, ECR-sputter or the like which is connected to the Cat-CVD chamber through the high vacuum.

In the field effect transistor 300, since the surface of the GaN epitaxial layer 12 is stabilized and the gate electrode 14, the source and drain electrodes 15 and 16 are then formed immediately after forming the GaN surface-nitrided layer 20, the interface between the gate, source and drain electrodes 14, 15 and 16 and the GaN epitaxial layer 12 is in an excellent state. As a result, characteristics of the field effect transistor 300 improve.

EXAMPLE 4

FIGS. 5A–5F are cross sectional views which show steps of manufacturing a field effect transistor according to the example 4, generally denoted at 400. In FIGS. 5A–5F, the same reference symbols as those used in FIGS. 2A–2D denote the same or corresponding portions. These manufacturing steps include the following steps 1 through 6.

Figure 5A:
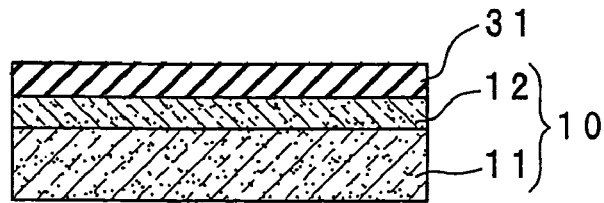
FIGS. 5A–5F are cross sectional views showing steps of manufacturing the field effect transistor according to the example 4.

Step 1: As shown in FIG. 5A, the substrate 10 having the substrate 11 of SiC or sapphire seating the GaN epitaxial layer 12 is prepared. Further, a spacer layer 31 of silicon oxide is formed on the substrate 10.

Figure 5B:
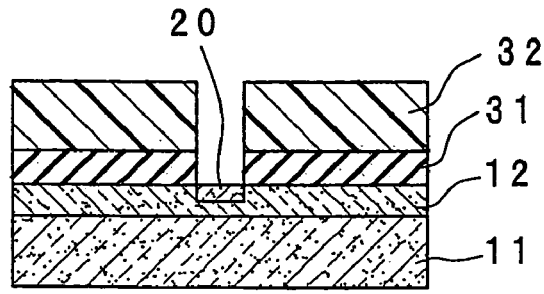

Step 2: As shown in FIG. 5B, a resist mask 32 is formed on the spacer layer 31 and an opening portion is formed on a gate region. In addition, using the resist mask 32, a surface of the gate region is nitrided, whereby the GaN surface-nitrided layer 20 is formed.

Figure 5C:
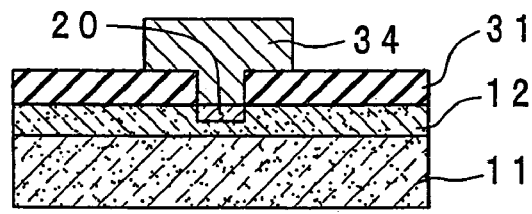

Step 3: As shown in FIG. 5C, after removal of the resist mask 32, a gate electrode 34 is formed. The gate electrode 34 is patterned so as to have a T-shaped cross section. After the gate electrode 34 is thus formed, the spacer layer 31 is selectively removed using buffered hydrofluoric acid (BHF).

Figure 5D:
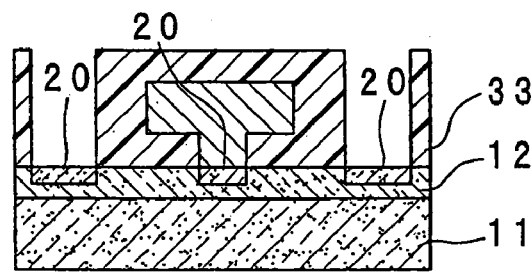

Step 4: As shown in FIG. 5D, a resist mask 33 is formed and an opening portion is formed on a source/drain region. Further, using the resist mask 33, a surface of the source/drain region is nitrided, whereby the GaN surface-nitrided layer 20 is formed.

Figure 5E:
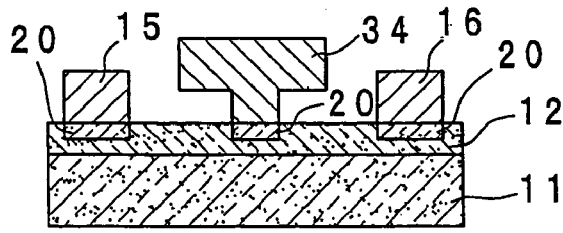

Step 5: As shown in FIG. 5E, by a lift-off method using the resist mask 33 for instance, the source and drain electrodes 15 and 16 are formed on the GaN surface-nitrided layer 20. Following this, the resist mask 33 is removed.

Figure 5F:
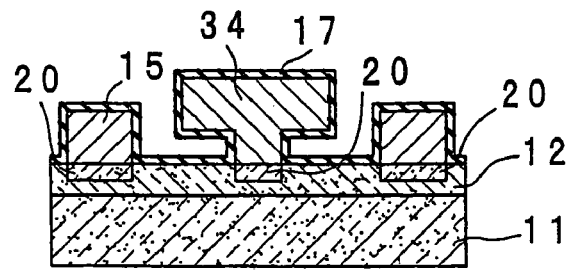

Step 6: As shown in FIG. 5F, the passivation film 17 of silicon nitride for instance is formed so as to cover the entire surface. At this step, the field effect transistor 400 is completed.

In the field effect transistor 400 having the T-shaped gate 34, since the surface of the GaN epitaxial layer 12 is stabilized, characteristics of the field effect transistor 400 improve.

EXAMPLE 5

FIGS. 6A–6F are cross sectional views which show steps of manufacturing a field effect transistor according to the example 5, generally denoted at 500. In FIGS. 6A–6F, the same reference symbols as those used in FIGS. 2A–2D denote the same or corresponding portions. These manufacturing steps include the following steps 1 through 6.

Figure 6A:
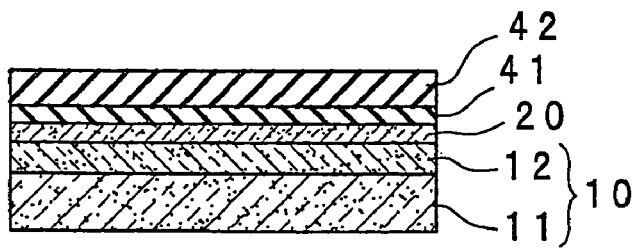
FIGS. 6A–6F are cross sectional views showing steps of manufacturing the field effect transistor according to the example 5.

Step 1: As shown in FIG. 6A, the substrate 10 having the substrate 11 of SiC or sapphire seating the GaN epitaxial layer 12 is prepared. Following this, the substrate 10 is treated using the catalytic chemical vapor reaction apparatus 50, the GaN surface-nitrided layer 20 is formed on the surface of the GaN epitaxial layer 12. Further, using the same apparatus, a first passivation film 41 of silicon nitride for instance is formed on the GaN surface-nitrided layer 20. A spacer layer 42 of silicon oxide for instance is formed on the first passivation film 41.

The first passivation film 41 may be successively formed in the same Cat-CVD chamber in which the GaN surface-nitrided layer 20 is formed, or may be successively formed in another Cat-CVD chamber which is connected to the Cat-CVD chamber through the high vacuum.

Furthermore, the first passivation film 41 may be made from other films, $Al_2O_3$ for example, other than the Cat-SiN film (a SiN film made by catalytic CVD), as long as the film is tolerant to BHF used in the selective removal step of the spacer layer 42 described below.

Figure 6B:
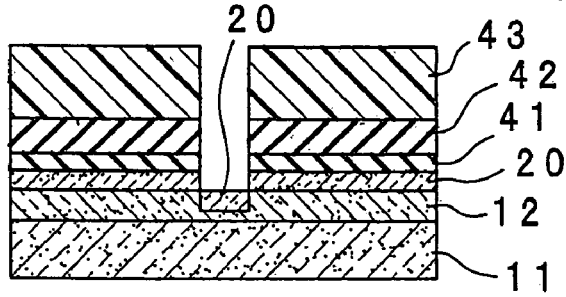

Step 2: As shown in FIG. 6B, a resist mask 43 is formed on the spacer layer 42 and an opening portion is formed on a gate region. In addition, using the resist mask 43, a surface of the gate region is nitrided, whereby the GaN surface-nitrided layer 20 is formed.

Figure 6C:
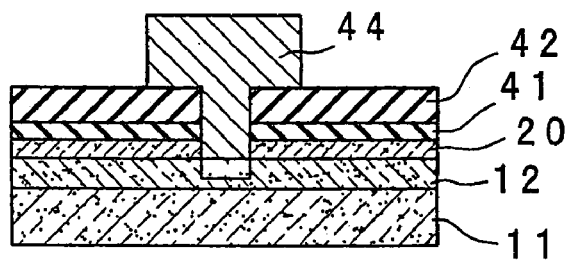

Step 3: As shown in FIG. 6C, after removal of the resist mask 43, a gate electrode 44 is formed. The gate electrode 44 is patterned so as to have a T-shaped cross section.

Figure 6D:
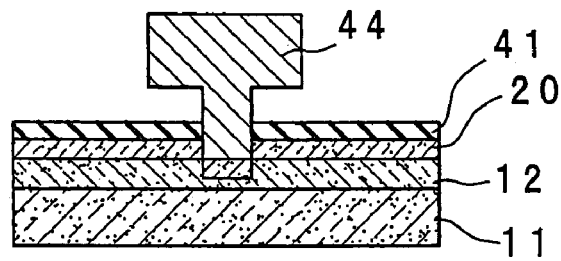

Step 4: As shown in FIG. 6D, after the gate electrode 44 is formed, the spacer layer 42 is selectively removed using buffered hydrofluoric acid (BHF).

Figure 6E:
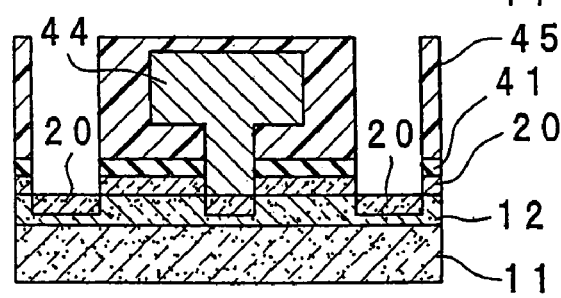

Step 5: As shown in FIG. 6E, a resist mask 45 is formed and an opening portion is formed on a source/drain region. Further, using the resist mask 45, a surface of the source/drain region is nitrided, whereby the GaN surface-nitrided layer 20 is formed.

Figure 6F:
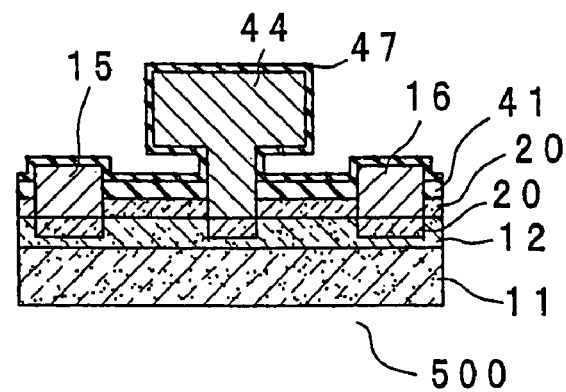

Step 6: As shown in FIG. 6F, by a lift-off method using the resist mask 45 for instance, the source and drain electrodes 15 and 16 are formed on the GaN surface-nitrided layer 20. Following this, the resist mask 45 is removed and a second passivation film 47 of silicon nitride for instance is formed so as to cover the entire surface. At this step, the field effect transistor 500 is completed.

In the field effect transistor 500, since the T-shaped gate electrode 44 is formed after forming the GaN surface-nitrided layer 20 on the surface of the substrate 10 in advance, the GaN surface-nitrided layer 20 is formed uniformly even under the T-shaped gate electrode 44. Hence, even under the T-shaped gate electrode 44 in particular, the interface between the GaN epitaxial layer 12 and the second passivation film 47 is in an excellent state.

EXAMPLE 6

FIGS. 7A–7D are cross sectional views which show steps of manufacturing a field effect transistor according to the example 6, generally denoted at 600. In FIGS. 7A–7D, the same reference symbols as those used in FIGS. 2A–2D denote the same or corresponding portions. These manufacturing steps include the following steps 1 through 4.

Figure 7A:
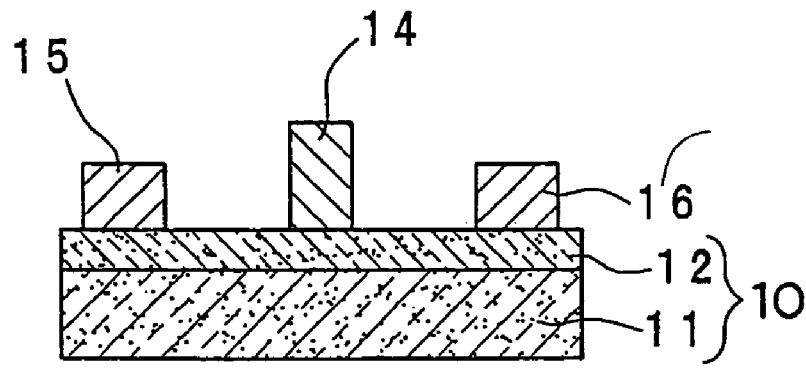
FIGS. 7A–7D are cross sectional views showing steps of manufacturing the field effect transistor according to the example 6.

Step 1: As shown in FIG. 7A, the substrate 10 having the substrate 11 of SiC or sapphire seating the GaN epitaxial layer 12 is prepared. Following this, the gate electrode 14 and the source and drain electrodes 15 and 16 opposing each other through the gate electrode 14 are formed on the epitaxial layer 12.

Figure 7B:
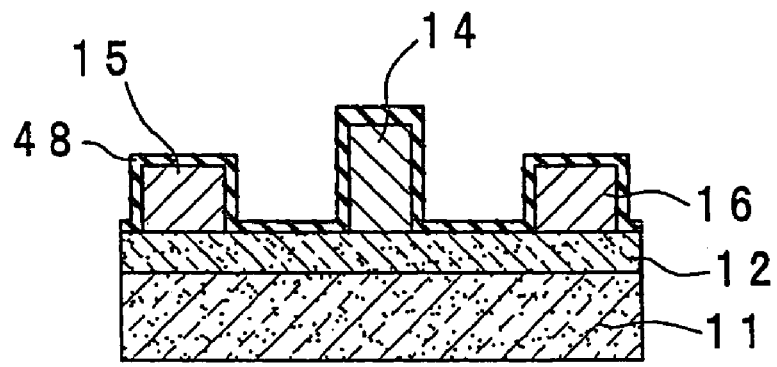

Step 2: As shown in FIG. 7B, a thin insulation film 48 is formed so as to cover the entire surface. The insulation film 48 is of silicon nitride for example, and has film thickness of from about 10 angstroms to about 50 angstroms, and preferably, of about 20 angstroms. An aluminum film having like thickness may be formed instead of the insulation film 48.

Figure 7C:
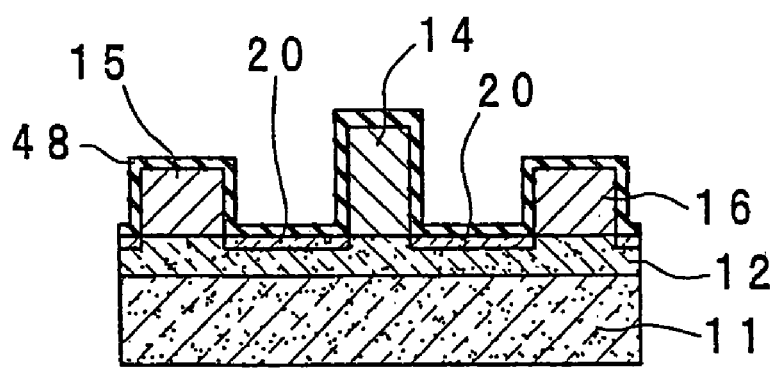

Step 3: As shown in FIG. 7C, using the catalytic chemical vapor reaction apparatus 50, the GaN epitaxial layer 12 is nitrided and the GaN surface-nitrided layer 20 is formed. The GaN epitaxial layer 12 is nitrided by means of atom-state nitrogen transmitted by the insulation film 48 (or an aluminum film).

Figure 7D:
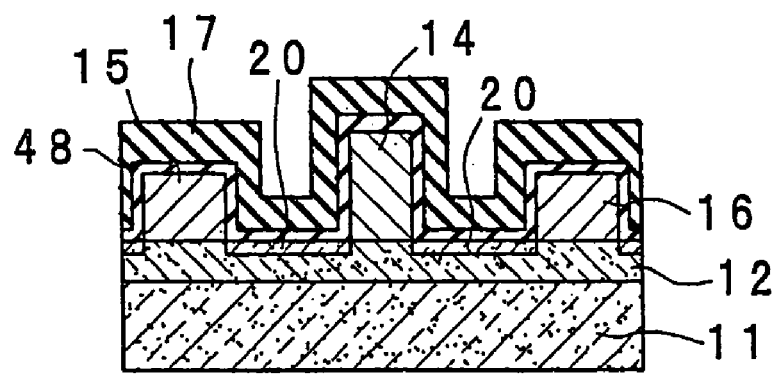

Step 4: As shown in FIG. 7D, the passivation film 17 of silicon nitride for instance is formed so as to cover the entire surface. The passivation film 17 and the insulation film 48 are both made of silicon nitride and integrated as one film. At this step, the field effect transistor 600 is completed.

In the field effect transistor 600, the respective electrodes are formed first, the GaN epitaxial layer 12 is then coated with the thin insulation film 48, and the surface of the epitaxial layer 12 is nitrided through the insulation film 48. Hence, while the passivation film is being formed directly on the epitaxial layer 12, penetration of nitrogen (formation of nitrogen-induced voids) is prevented at the initial stage of formation of the passivation film which would otherwise occur, which in turn allows to maintain the interface between the epitaxial layer 12 and the passivation film 17 (insulation film 48) in an excellent state.

What is claimed is:

1. A method of manufacturing a semiconductor device including a gallium nitride related semiconductor material, the method comprising:
   preparing a substrate having a surface that is a gallium nitride related semiconductor material;
   forming an aluminum layer on the surface of the substrate;
   producing atomic nitrogen by passing a nitrogen-containing gas across a heated catalytic member;
   contacting a surface of the aluminum layer with the atomic nitrogen to nitride the surface of the aluminum layer; and
   forming, on the surface, a gate electrode and source and drain electrodes on opposite sides of the gate electrode.

2. A method of manufacturing a semiconductor device including a gallium nitride related semiconductor material, the method comprising:
   preparing a substrate having a surface that is a gallium nitride related semiconductor material;
   forming, on the surface, a gate electrode and source and drain electrodes on opposite sides of the gate electrode;
   decomposing a nitrogen-containing gas in a catalytic reaction to produce atomic nitrogen; and
   contacting the surface, at an area between the source electrode and the gate electrode and at an area between the drain electrode and the gate electrode, with the atomic nitrogen, to nitride the surface.

3. The method according to claim 2, including, in the nitriding, forming an aluminum layer on the surface and nitriding a surface of the aluminum layer.

4. The method according to claim 2, including decomposing the nitrogen-containing gas into atomic nitrogen by passing the nitrogen-containing gas across a heated catalytic member.

5. A method of manufacturing a semiconductor device including a gallium nitride related semiconductor material, the method comprising:
   preparing a substrate having a surface that is a gallium nitride related semiconductor material;
   forming, on the surface, a gate electrode and source and drain electrodes on opposite sides of the gate electrode;
   forming one of an insulating film and an aluminum film covering all of the surface and having a thickness in a range of 10 to 50 Angstroms;
   decomposing a nitrogen-containing gas in a catalytic reaction to produce atomic nitrogen; and
   contacting the surface, at an area between the source electrode and the gate electrode and at an area between the drain electrode and the gate electrode, with the atomic nitrogen, nitriding the surface.

6. The method according to claim 5, wherein, in the nitriding, the atomic nitrogen passes through the insulating or aluminum film and contacts the surface so the surface is nitrided.

7. The method according to claim 5, including decomposing the nitrogen-containing gas into atomic nitrogen by passing the nitrogen-containing gas across a heated catalytic member.

* * * * *